(12) United States Patent
Heo

(10) Patent No.: US 10,510,647 B2
(45) Date of Patent: Dec. 17, 2019

(54) SEMICONDUCTOR PACKAGE

(71) Applicant: SAMSUNG ELECTRONICS CO., LTD., Suwon-si (KR)

(72) Inventor: Jee Ae Heo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/943,072

(22) Filed: Apr. 2, 2018

(65) Prior Publication Data

US 2019/0189547 A1    Jun. 20, 2019

(30) Foreign Application Priority Data

Dec. 15, 2017    (KR) .......................... 10-2017-0173580

(51) Int. Cl.
*H01L 23/498*    (2006.01)
*H01L 23/538*    (2006.01)
(Continued)

(52) U.S. Cl.
CPC .. *H01L 23/49822* (2013.01); *H01L 23/49816* (2013.01); *H01L 23/49894* (2013.01);
(Continued)

(58) Field of Classification Search
CPC ......... H01L 23/49816; H01L 23/49822; H01L 43/49833; H01L 24/16; H01L 23/538;
(Continued)

(56) References Cited

U.S. PATENT DOCUMENTS 6,400,021 B1 *  6/2002  Cho ................... H01L 23/3107
                                                    257/738
2004/0070079 A1 *  4/2004  Huang ................... H01L 24/05
                                                    257/778
(Continued)

FOREIGN PATENT DOCUMENTS

KR    10-2004-0083192 A    10/2004
KR    10-2008-0024059 A1    3/2008
(Continued)

OTHER PUBLICATIONS

Communication dated Mar. 21, 2019, issued by the Korean Intellectual Property Office in counterpart Korean Application No. 10-2017-0173580.
(Continued)

*Primary Examiner* — Jasmine J Clark
(74) *Attorney, Agent, or Firm* — Sughrue Mion, PLLC

(57) ABSTRACT

A semiconductor package includes an organic interposer, a semiconductor chip, a passivation layer, and an underbump metallurgy (UBM) layer. The organic interposer includes insulating layers and wiring layers disposed on the insulating layers. The semiconductor chip is disposed on one surface of the organic interposer. The passivation layer is disposed on another surface of the organic interposer opposing the one surface on which the semiconductor chip is disposed, and has openings extending to portions of the wiring layer. The UBM layer includes UBM pads disposed on the passivation layer and UBM vias disposed in the openings and connecting the UBM pads and the wiring layer to each other. At least one groove portion is disposed in an outer circumferential surface of the UBM pad.

20 Claims, 6 Drawing Sheets

(51) Int. Cl.
*H01L 25/18* (2006.01)
*H01L 23/00* (2006.01)
*H01L 25/065* (2006.01)
*H01L 25/10* (2006.01)

(52) U.S. Cl.
CPC ...... *H01L 23/5383* (2013.01); *H01L 23/5386* (2013.01); *H01L 24/05* (2013.01); *H01L 24/13* (2013.01); *H01L 24/16* (2013.01); *H01L 24/32* (2013.01); *H01L 24/73* (2013.01); *H01L 24/81* (2013.01); *H01L 24/92* (2013.01); *H01L 25/0655* (2013.01); *H01L 25/105* (2013.01); *H01L 25/18* (2013.01); *H01L 2224/0401* (2013.01); *H01L 2224/16227* (2013.01); *H01L 2224/16235* (2013.01); *H01L 2224/16238* (2013.01); *H01L 2224/32225* (2013.01); *H01L 2224/73204* (2013.01); *H01L 2224/92125* (2013.01); *H01L 2225/1023* (2013.01); *H01L 2225/1058* (2013.01); *H01L 2924/10252* (2013.01); *H01L 2924/10253* (2013.01); *H01L 2924/10329* (2013.01); *H01L 2924/1433* (2013.01); *H01L 2924/1436* (2013.01); *H01L 2924/15192* (2013.01); *H01L 2924/15311* (2013.01); *H01L 2924/15331* (2013.01); *H01L 2924/1816* (2013.01); *H01L 2924/18161* (2013.01); *H01L 2924/19105* (2013.01); *H01L 2924/3512* (2013.01)

(58) Field of Classification Search
CPC ............ H01L 24/81; H01L 2224/0401; H01L 23/49833; H01L 23/5383; H01L 2924/1436; H01L 24/96; H01L 2224/16227; H01L 2224/16235; H01L 2924/1816; H01L 25/18; H01L 2924/1433; H01L 24/13; H01L 24/32; H01L 24/73; H01L 24/92; H01L 25/0655; H01L 25/105; H01L 2224/16238; H01L 2224/32225; H01L 2224/73204; H01L 2224/92125; H01L 2225/1023; H01L 2225/1058; H01L 2924/10252; H01L 2924/10253; H01L 2924/10329; H01L 24/05; H01L 2924/15192; H01L 2924/15311; H01L 2924/18161; H01L 2924/19105; H01L 2924/3512; H01L 23/5386; H01L 23/49894
See application file for complete search history.

(56) References Cited

U.S. PATENT DOCUMENTS

| | | |
|---|---|---|
| 2006/0043568 A1* | 3/2006 | Abe ............... H01L 21/4857 257/698 |
| 2008/0062665 A1 | 3/2008 | Nakatsuka et al. |
| 2011/0049725 A1 | 3/2011 | Topacio et al. |
| 2011/0241201 A1 | 10/2011 | Wang et al. |
| 2011/0254156 A1 | 10/2011 | Lin |
| 2013/0008705 A1 | 1/2013 | Tseng et al. |
| 2013/0049234 A1 | 2/2013 | Lin et al. |
| 2013/0258625 A1* | 10/2013 | Terui ............... H05K 1/115 361/774 |
| 2016/0233180 A1 | 8/2016 | Walker |
| 2016/0372395 A1 | 12/2016 | Shih et al. |
| 2017/0141055 A1 | 5/2017 | Liu et al. |
| 2017/0141063 A1 | 5/2017 | Lee et al. |

FOREIGN PATENT DOCUMENTS

| | | |
|---|---|---|
| KR | 10-2017-0057997 A | 5/2017 |
| TW | 201724422 A | 7/2017 |

OTHER PUBLICATIONS

Search Report issued in corresponding Taiwanese Application No. 107111462, dated Feb. 19, 2019.

* cited by examiner

I-I'

SEMICONDUCTOR PACKAGE

CROSS-REFERENCE TO RELATED APPLICATION(S)

This application claims benefit of priority to Korean Patent Application No. 10-2017-0173580 filed on Dec. 15, 2017 in the Korean Intellectual Property Office, the disclosure of which is incorporated herein by reference in its entirety.

BACKGROUND

1. Field

The present disclosure relates to a semiconductor package.

2. Description of Related Art

In accordance with improvement of specifications of and increased use of high bandwidth memory (HBM), the market for interposers has grown. Currently, silicon has been mainly used as a material of the interposer, but development of a glass or organic interposer has been conducted in order to increase an area and reduce a cost.

Meanwhile, an underbump metallurgy (UBM) layer is added beneath solder balls connecting the interposer and a board such as a mainboard to each other to alleviate thermal or mechanical impact, resulting in improvement of reliability and a lifespan of a package. However, reliability of interconnection portions is affected by a structure of the UBM layer, and the structure of the UBM layer thus needs to be optimized.

SUMMARY

An aspect of the present disclosure may provide a semiconductor package in which high reliability of electrical connection structures may be secured.

According to an aspect of the present disclosure, a semiconductor package may be provided, in which an underbump metallurgy (UBM) layer is introduced beneath electrical connection structures, and UBM pads of the UBM layer are provided to have an outline having a protruding shape rather than a circular shape to increase a bonded area between the electrical connection structures and the UBM pads.

According to an aspect of the present disclosure, a semiconductor package may include an organic interposer, a semiconductor chip, an encapsulant, a passivation layer, and a UBM layer. The organic interposer includes insulating layers and wiring layers disposed on the insulating layers. The semiconductor chip is disposed on one surface of the organic interposer and has an active surface having connection pads disposed thereon and an inactive surface opposing the active surface. The encapsulant is disposed on the organic interposer and encapsulates at least portions of the semiconductor chip. The passivation layer is disposed on the other surface of the organic interposer opposing the one surface of the organic interposer on which the semiconductor chip is disposed and has openings extending to at least portions of the wiring layer. The UBM layer includes UBM pads disposed on the passivation layer and UBM vias disposed in the openings and connecting the UBM pads and the wiring layer to each other. At least one groove portion is disposed in an outer circumferential surface of the UBM pad.

According to another aspect of the present disclosure, a semiconductor package may include a semiconductor chip, an encapsulant, a connection member, a passivation layer, and a UBM layer. The semiconductor chip has an active surface having connection pads disposed thereon and an inactive surface opposing the active surface. The encapsulant encapsulates at least portions of the semiconductor chip, and the connection member is disposed on the active surface of the semiconductor chip and includes a wiring layer electrically connected to the connection pads. The passivation layer is disposed on the connection member and has openings extending to at least portions of the wiring layer. The UBM layer includes UBM pads disposed on the passivation layer and UBM vias disposed in the openings and connecting the UBM pads and the exposed wiring layer to each other. A boundary of the UBM pad includes at least one concave portion when the UBM pad is viewed from a direction perpendicular to a surface of the passivation layer.

According to a further aspect of the present disclosure, an interposer configured to have a semiconductor chip mounted on an upper surface thereof includes an insulating material forming a body of the interposer, pluralities of wiring layers and vias, a passivation layer, and at least one connection pad. The plurality of wiring layers are disposed in an insulating material of the body, and are disposed on the upper surface of the interposer to be connected to connections pads of the semiconductor chip. The plurality of vias penetrate through the insulating material of the body to interconnect adjacent wiring layers of the plurality of wiring layers. The passivation layer is disposed on a lower surface of the interposer opposite to the upper surface and has a plurality of openings each extending to a wiring layer. The at least one connection pad is disposed on a lower surface of the passivation layer, and is connected to the wiring layer through a connection via extending through an opening of the plurality of openings. An outline of an area occupied by the at least one connection pad on the lower surface of the passivation layer includes at least one concave portion.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or stylized for clarity.

Herein, a lower side, a lower portion, a lower surface, and the like, are used to refer to a direction toward amounting surface of the semiconductor package including an organic interposer in relation to cross sections of the drawings, while an upper side, an upper portion, an upper surface, and the like, are used to refer to an opposite direction to the lower direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" includes a physical connection and a physical disconnection that nonetheless provides electrical connectivity. It can be understood that when an element is referred to with "first" and "second", the element is not limited thereby. The terms "first" and "second" may be used only for purposes of distinguishing one element from other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part with one another. For example, one element described in a particular exemplary embodiment, even if it is not described in another exemplary embodiment, may be understood as a description related to the other exemplary embodiment, unless an opposite or contradictory description is provided therein.

Terms used herein are used only in order to describe an exemplary embodiment rather than limit the present disclosure. In this case, singular forms include plural forms unless interpreted otherwise in context.

Electronic Device

Figure 1:
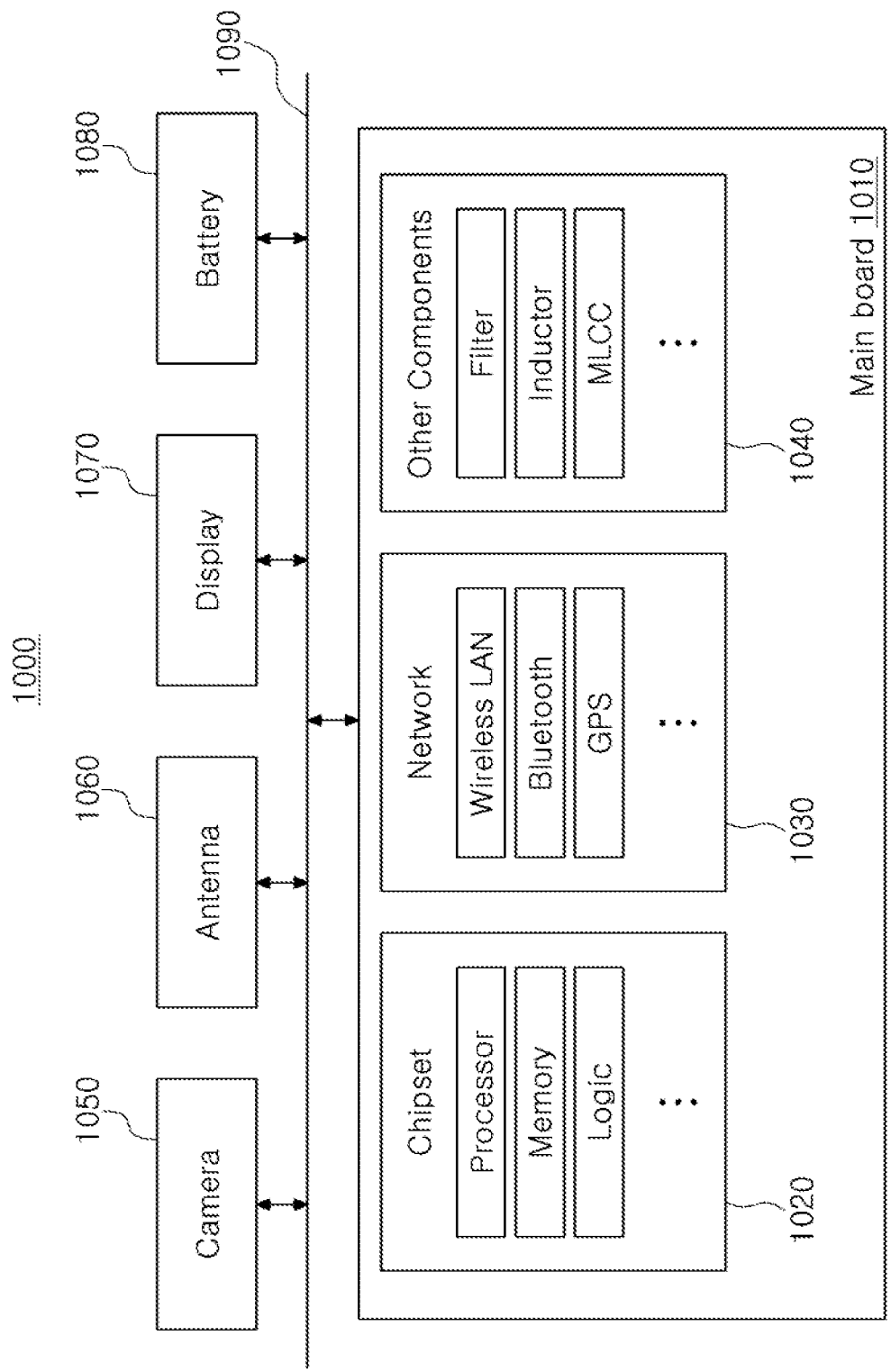
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below across various signal lines 1090.

The chip related components 1020 or chipset may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, and may also include other types of chip related components. In addition, the chip related components 1020 may be combined with each other.

The network related components 1030 may include components supporting communications using various protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the above-mentioned protocols. However, the network related components 1030 are not limited thereto, and may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
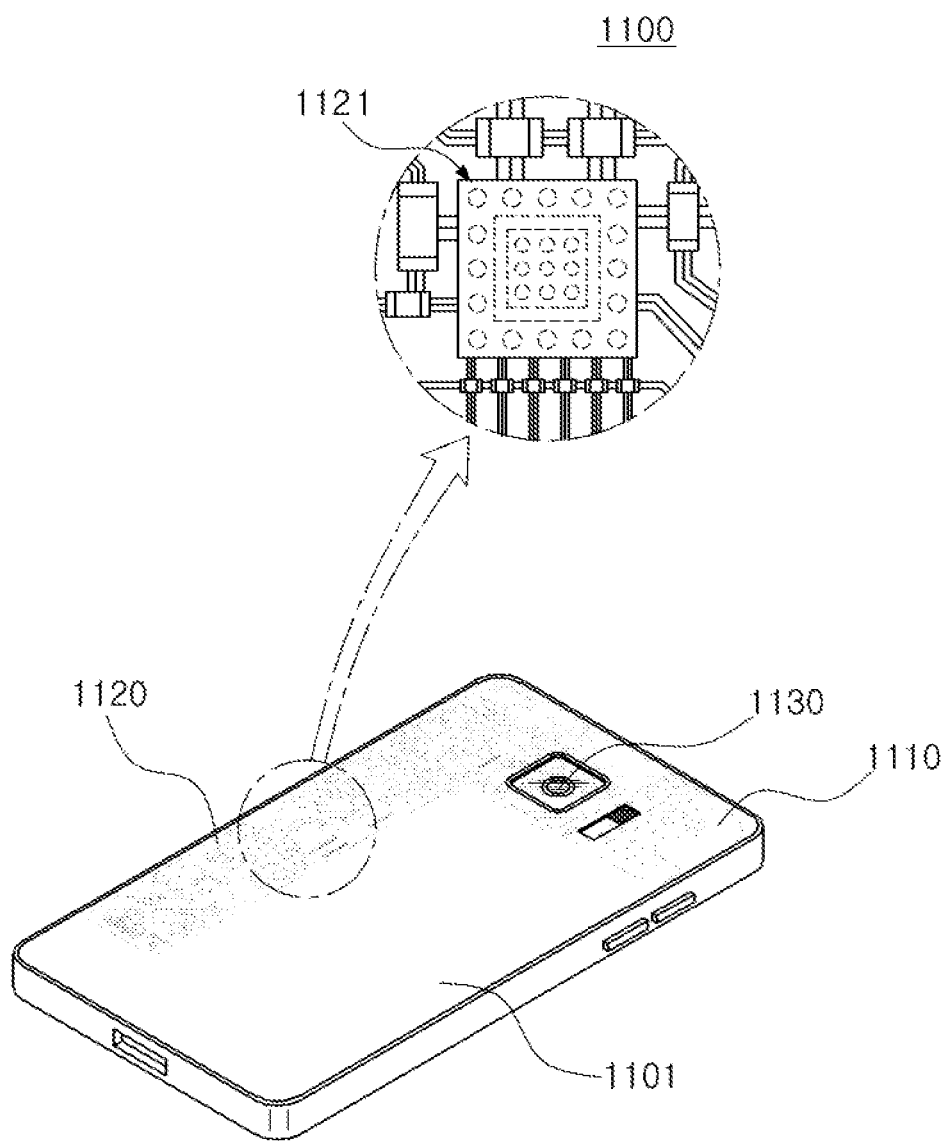
FIG. 2 is a schematic perspective view illustrating an example of an electronic device.

FIG. 2 is a schematic perspective view illustrating an example of an electronic device.

Referring to FIG. 2, a semiconductor package including an organic interposer may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the motherboard 1110, such as a camera module 1130, may be accommodated in the body 1101. Some of the electronic components 1120 may be chip related components, and some of the chip related components may be an interposer package 1121. Meanwhile, the electronic device is not necessarily limited to the smartphone 1100, and may be other electronic devices.

Semiconductor Package Including Organic Interposer

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, and may be packaged and used in an electronic device, or the like, in a packaged state.

Here, semiconductor packaging can be required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard may advantageously be used.

A semiconductor package including an organic interposer manufactured by the packaging technology described above will be described hereinafter in more detail with reference to the drawings.

Figure 3:
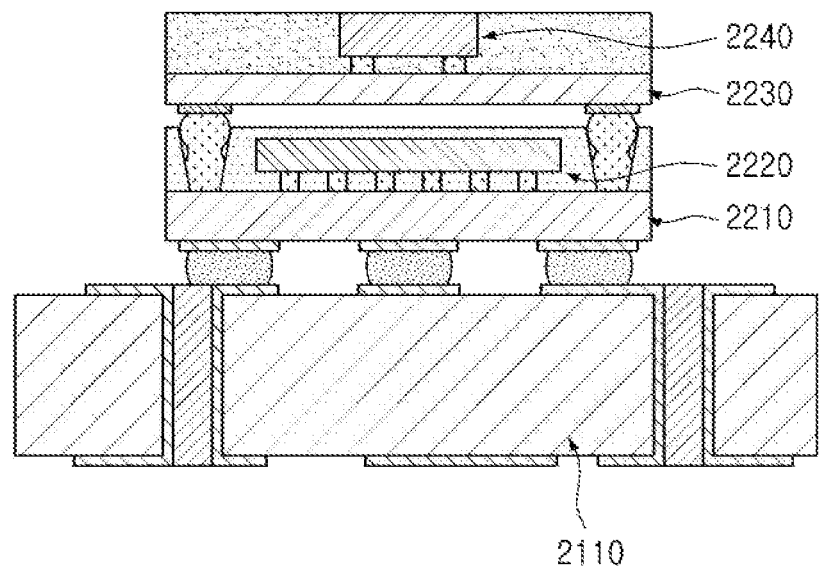
FIG. 3 is a schematic cross-sectional view illustrating a 3D ball grid array (BGA) package mounted on a mainboard of an electronic device.

FIG. 3 is a schematic cross-sectional view illustrating a 3D ball grid array (BGA) package mounted on a mainboard of an electronic device.

An application specific integrated circuit (ASIC) such as a graphics processing unit (GPU), among semiconductor chips, is very expensive, and it is thus very important to perform packaging on the ASIC at a high yield. For this purpose, a ball grid array (BGA) substrate 2210, or the like, that may redistribute several thousands to several hundreds of thousands of connection pads is prepared before a semiconductor chip is mounted thereon, and the semiconductor chip that is expensive, such as a GPU 2220, or the like, is mounted and packaged on the BGA substrate 2210 by surface mounting technology (SMT), or the like, and is then mounted ultimately on a mainboard 2110.

Meanwhile, in a case of the GPU 2220, it is advantageous to significantly reduce a signal path between the GPU 2220 and a memory such as a high bandwidth memory (HBM). To this end, a product can be used in which a semiconductor chip such as the HBM 2240 is mounted and then packaged on an interposer 2230, and is then stacked on a package in which the GPU 2220 is mounted, in a package-on-package (POP) form. However, in this case, a thickness of a device is excessive increased, and there is a limitation in significantly reducing the signal path.

Figure 4:
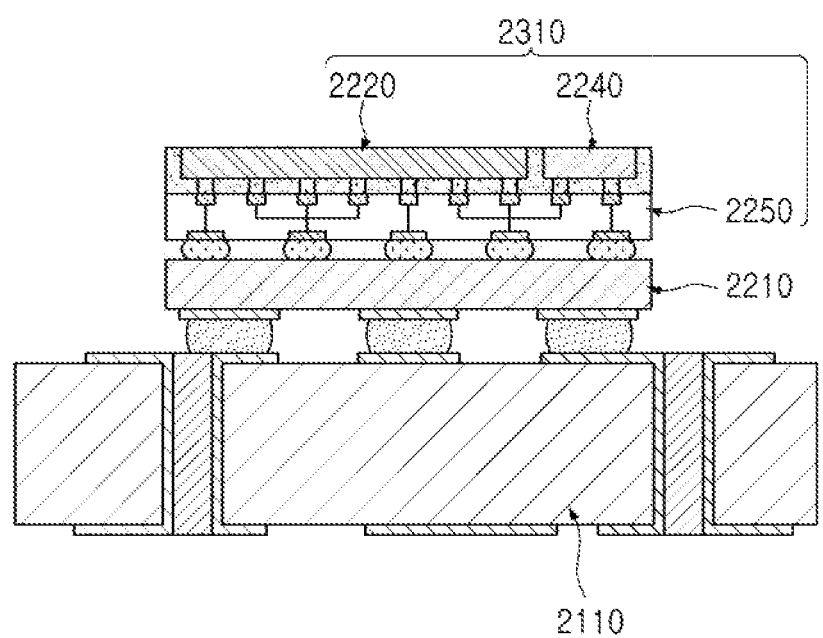
FIG. 4 is a schematic cross-sectional view illustrating a 2.5D silicon interposer package mounted on a mainboard.

FIG. 4 is a schematic cross-sectional view illustrating a 2.5D silicon interposer package mounted on a mainboard.

As a method for solving the problem described above, the manufacturing of a semiconductor package 2310 including an organic interposer by 2.5D interposer technology of surface-mounting and then packaging a first semiconductor chip such as a GPU 2220 and a second semiconductor chip such as an HBM 2240 side-by-side with each other on a silicon interposer 2250 may be considered. In this case, the GPU 2220 and the HBM 2240 having several thousands to several hundreds of thousands of connection pads may be redistributed by the silicon interposer 2250, and may be electrically connected to each other through the shortest path. In addition, when the semiconductor package 2310 including a silicon interposer 2250 is again mounted and redistributed on a BGA substrate 2210, or the like, it may be ultimately mounted on a mainboard 2110. However, it is very difficult to form through-silicon vias (TSVs) in the silicon interposer 2250, and a cost for manufacturing the silicon interposer 2250 is significantly high, and the silicon interposer 2250 is thus disadvantageous in increasing an area and reducing a cost.

Figure 5:
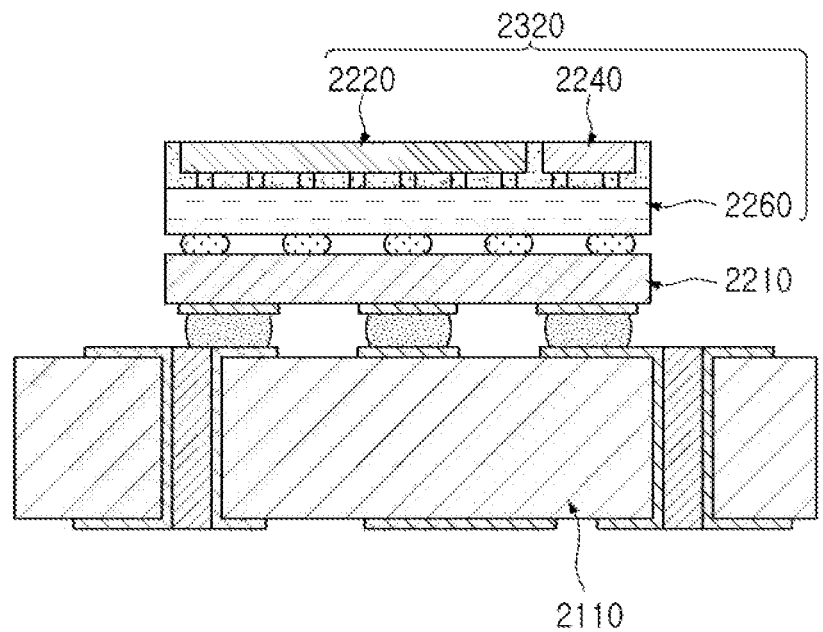
FIG. 5 is a schematic cross-sectional view illustrating a 2.5D organic interposer package mounted on a mainboard.

FIG. 5 is a schematic cross-sectional view illustrating another 2.5D organic interposer package mounted on a mainboard.

As a method for solving the problem described above, the use of an organic interposer 2260 instead of the silicon interposer 2250 may be considered. For example, the manufacturing of a semiconductor package 2320 can include an organic interposer 2260 by 2.5D interposer technology of surface-mounting and then packaging a first semiconductor chip such as a GPU 2220 and a second semiconductor chip such as an HBM 2240 side-by-side with each other on the organic interposer 2260. In this case, the GPU 2220 and the HBM 2240 having several thousands to several hundreds of thousands of connection pads may be redistributed by the organic interposer 2260, and may be electrically connected to each other through the shortest path. In addition, when the semiconductor package 2320 including the organic interposer 2260 is again mounted and redistributed on a BGA substrate 2210, or the like, it may be ultimately mounted on a mainboard 2110. In addition, the organic interposer 2260 may be advantageous in increasing an area and reducing a cost.

Meanwhile, the semiconductor package 2320 including an organic interposer 2260 is manufactured by performing a package process of mounting chips 2220 and 2240 on the organic interposer 2260 and then molding the chips. The reason is that when a molding process is not performed, package handling is not conducted, such that the package may not be connected to the BGA substrate 2210, or the like. Therefore, rigidity of the package is maintained by the molding. However, when the molding process is performed, warpage of the package may occur, fillability of an underfill resin may be deteriorated, and a crack between a die and a molding material may occur, due to mismatch between coefficients of thermal expansion (CTEs) of the interposer 2260 and the molding material of the chips 2220 and 2240, as described above.

To address the shortcomings detailed above, a semiconductor package in which high reliability of electrical connection structures may be secured will be described hereinafter with reference to the drawings.

Figure 6:
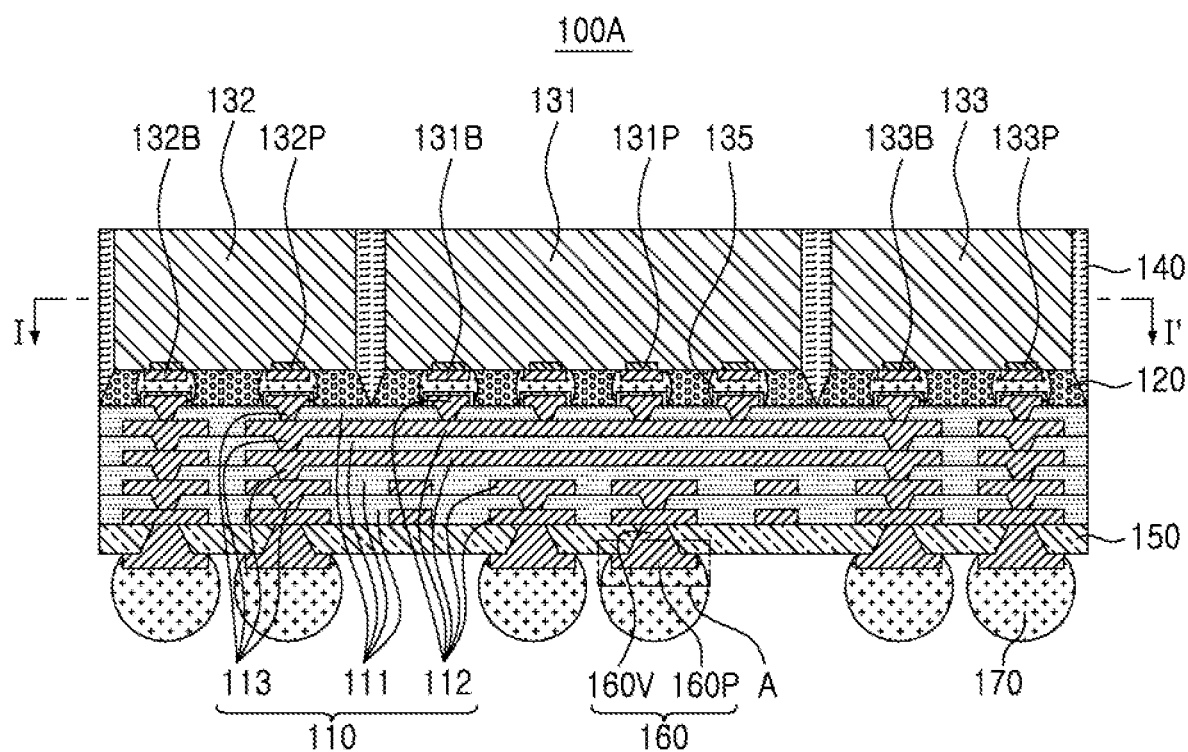
FIG. 6 is a schematic cross-sectional view illustrating an example of a semiconductor package.

FIG. 6 is a schematic cross-sectional view illustrating an example of a semiconductor package.

Figure 7:
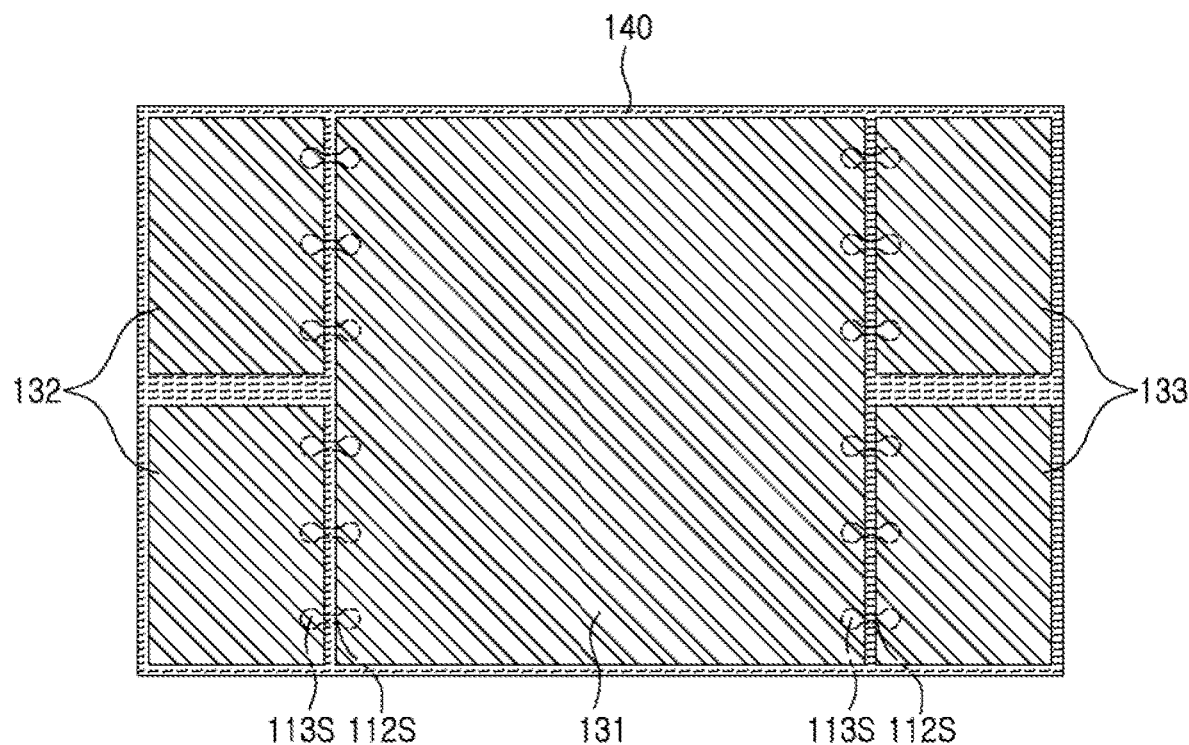
FIG. 7 is a schematic plan view taken along line I-I' of the semiconductor package of FIG. 6.

FIG. 7 is a schematic plan view taken along line I-I' of the semiconductor package of FIG. 6.

Figure 8:
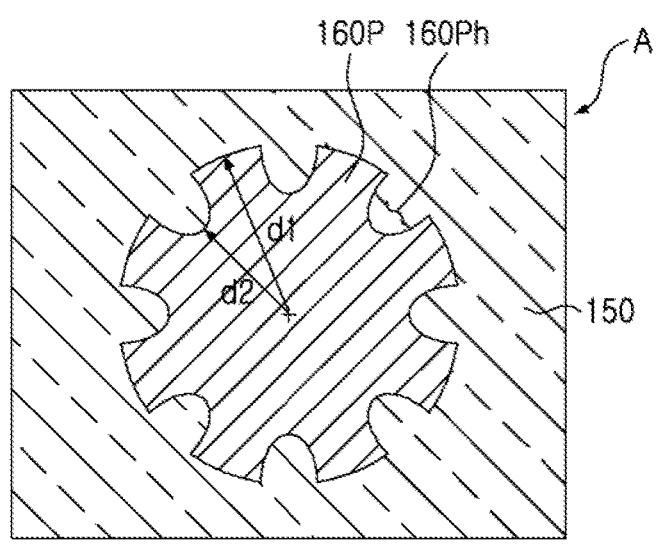
FIG. 8 is a schematic enlarged plan view of region A of the semiconductor package of FIG. 6.

FIG. 8 is a schematic enlarged plan view of region A of the semiconductor package of FIG. 6. The view shown in FIG. 8 may be provided from a viewpoint disposed above the semiconductor package shown in FIG. 6, such as a same viewpoint as that providing the plan view of FIG. 7.

Referring to FIGS. 6 through 8, a semiconductor package 100A according to an exemplary embodiment in the present disclosure may include an interposer 110 including insulating layers 111 and wiring layers 112 and vias 113 formed on and in the insulating layers 111. The semiconductor package 100A further includes a first semiconductor chip 131 disposed on the interposer 110 and having an active surface having connection pads 131P disposed thereon and an inactive surface opposing the active surface. The semiconductor package 100A further includes a plurality of second semiconductor chips 132 and 133 disposed side-by-side with the first semiconductor chip 131 on the interposer 110 and having active surfaces having connection pads 132P and 133P disposed thereon and inactive surfaces opposing the active surfaces, respectively. The semiconductor package 100A further includes an encapsulant 140 disposed on the interposer 110 and encapsulating at least portions of the first semiconductor chip 131 and the plurality of second semiconductor chips 132 and 133, a passivation layer 150 disposed on the other surface of the interposer 110 and having openings exposing at least portions of the wiring layer 112, an underbump metallurgy (UBM) layer 160 including UBM pads 160P disposed on the passivation layer 150 and UBM vias 160V formed in the openings of the passivation layer 150 and connecting the UBM pads 160P and the exposed wiring layer 112 to each other, and electrical connection structures 170 disposed on the passivation layer 150 and connected to the UBM pads 160P.

Meanwhile, a distance from the center of the UBM pad 160P to a boundary thereof may be irregular. For example, a distance d1 from the center of the UBM pad 160P to a boundary most distant from the center and a distance d2 from the center of the UBM pad 160P to a boundary closest to the center may be different from each other. In more detail, at least one groove portion 160Ph, more preferably, a plurality of groove portions 160Ph may be formed in an outer circumferential surface of the UBM pad 160P. In this case, a distance d1 may extend from the center of the UBM pad 160P to an outer circumferential surface of a region in which the groove portion 160Ph of the UBM pad 160P is not formed, and the distance d1 may be greater than a distance d2 that extends from the center of the UBM pad 160P to an outer circumferential surface of a region in which the groove portion 160Ph of the UBM pad 160P is formed. The groove portion 160Ph of the UBM pad 160P may be filled with the electrical connection structure 170. As described above, the semiconductor package 100A according to the exemplary embodiment includes the UBM layer 160, and reliability of the electrical connection structure 170 may thus be further improved. Particularly, the UBM pad 160P does not have a simple circular shape, but may have, for example, a toothed wheel shape having protruding portions in a plane to increase a contact area between the UBM pad 160P and the electrical connection structure 170, so as to have an anchoring effect, and to disperse shearing stress, resulting in further improvement of the reliability of the electrical connection structure 170. The toothed wheel shape can include a plurality of tooth protrusions spaced apart from each other and extending from central portion of the UBM pad. The UBM pad 160P may have an uneven boundary that includes at least one concave portion, when viewed from a direction perpendicular to a surface of the passivation layer.

The respective components included in the semiconductor package 100A according to the exemplary embodiment will be described hereinafter below in more detail.

The interposer 110 may redistribute the connection pads 131P, 132P, and 133P of the semiconductor chips 131, 132, and 133. Several thousands to several hundreds of thousands of connection pads 131P, 132P, and 133P of the semiconductor chips 131, 132, and 133 having various functions may be redistributed by the interposer 110, and may be physically or electrically externally connected through the electrical connection structures 170 depending on the functions. In addition, the connection pads 131P, 132P, and 133P of the semiconductor chips 131, 132, and 133 maybe electrically connected to each other through the shortest paths by the interposer 110. That is, the interposer 110 may be used as a connection member. The interposer 110 may include the insulating layers 111, the wiring layers 112 formed on or in the insulating layers 111, and the vias 113 penetrating through the insulating layers 111 and electrically connecting the wiring layers 112 formed on different layers to each other. The number of layers of the interposer 110 may be more than that illustrated in the drawing or be less than that illustrated in the drawing. The interposer 110 having such a form may be used as a 2.5D type organic interposer.

The insulating layer 111 may serve as a dielectric layer of the interposer 110. For example, an insulating material may be used as a material of the insulating layer 111. In this case, a thermosetting resin such as an epoxy resin, a thermoplastic resin such as a polyimide resin, a resin in which the thermosetting resin and the thermoplastic resin are mixed with an inorganic filler, for example, Ajinomoto build-up film (ABF), or the like, may be used as the insulating material. Alternatively, a resin in which a thermosetting resin or a thermoplastic resin is impregnated together with an inorganic filler in a core material such as a glass fiber (or a glass cloth or a glass fabric), for example, prepreg, or the like, may also be used as the insulating material. Alternatively, a photosensitive insulating material such as a photoimageable dielectric (PID) resin may be used as the insulating material. When the insulating layers 111 include multiple layers, materials of the insulating layers 111 maybe the same as each other, and may alternatively be different from each other, if desired. When the insulating layers 111 include multiple layers, the insulating layers 111 may be integrated with each other depending on a process, such that boundaries therebetween may not be apparent.

The wiring layers 112 may serve to substantially redistribute the connection pads 131P, 132P, and 133P and connect the connection pads 131P, 132P, and 133P to each other and/or to connections structures 170 depending on a signal, power, or the like. That is, the connection pads 131P, 132P, and 133P may be electrically connected to each other through connection patterns 112s and connection vias 113s of the wiring layer 112. A material of each of the wiring layers 112 may be a conductive material such as copper (Cu), aluminum (Al), silver (Ag), tin (Sn), gold (Au), nickel (Ni), lead (Pb), titanium (Ti), or alloys thereof. The wiring layers 112 may perform various functions depending on designs of their corresponding layers. For example, the wiring layers 112 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the wiring layers 112 may include via pads, electrical connection structures pads, and the like. A surface treatment layer P may be formed on surfaces of patterns serving as pads for mounting the semiconductor chips 131, 132, and 133 in the wiring layer 112. The surface treatment layer P is not particularly limited, and may be formed by, for example, electrolytic gold plating, electroless gold plating, organic solderability preservative (OSP) or electroless tin plating, electroless silver plating, electroless nickel plating/ substituted gold plating, direct immersion gold (DIG) plating, hot air solder leveling (HASL), or the like.

The vias 113 may electrically connect the wiring layers 112 formed on different layers to each other, resulting in an electrical path in the semiconductor package 100A. A material of each of the vias 113 may be a conductive material such as copper (Cu), aluminum (Al), silver (Ag), tin (Sn), gold (Au), nickel (Ni), lead (Pb), titanium (Ti), or alloys thereof. The vias 113 may be completely filled with a conductive material, but are not limited thereto. A cross-sectional shape of each of the vias 113 may be an approximately reverse trapezoidal shape as shown in the drawing.

The underfill resin 120 may fix the semiconductor chips 131, 132, and 133 to the interposer 110. A material including epoxy, or the like, may be used as a material of the underfill resin 120. The underfill resin 120 may be omitted, if desired. Meanwhile, although not illustrated in the drawings, passive components may also be disposed and packaged in parallel with (or adjacent to) the semiconductor chips 131, 132, and 133 on the interposer 110, if desired.

Each of the semiconductor chips 131, 132, and 133 may be an integrated circuit (IC) that provides several hundreds to several millions of elements or more integrated in a single chip. In this case, a base material of a body of each of the semiconductor chips may be silicon (Si), germanium (Ge), gallium arsenide (GaAs), or the like. Various circuits may be formed on each of the bodies. The connection pads 131P, 132P, and 133P of the semiconductor chips 131, 132, and 133 may electrically connect the semiconductor chips 131, 132, and 133 to other components. A material of each of the connection pads 131P, 132P, and 133P may be a conductive material such as aluminum (Al), or the like. A passivation layer exposing the connection pads 131P, 132P, and 133P may be formed on each of the bodies, and may be an oxide film, a nitride film, or the like, or a double layer of an oxide layer and a nitride layer. An insulating layer, and the like, may also be further disposed in appropriate positions. Redistribution layers may further be formed on the active surfaces of the semiconductor chips 131, 132, and 133, and low melting point metals 131B, 132B, and 133B, or the like, may also be connected to the connection pads 131P, 132P, and 133P, respectively. The low melting point metals 131B, 132B, and 133B may be metals having a melting point lower than that of the connection pads 131P, 132P, and 133P, for example, solders or alloys including solders. The semiconductor chips 131, 132, and 133 may be connected to an exposed wiring layer 112 of an upper portion of the interposer 110 through the connection pads 131P, 132P, and 133P and/or through the low melting point metals 131B, 132B, and 133B, and connectors 135 such as solders, or the like, may be used for the connection. The respective semiconductor chips 131, 132, and 133 may be fixed to the interposer 110 by the underfill resin 120.

The first semiconductor chip 131 may be an ASIC such as a GPU. Each of the plurality of second semiconductor chips 132 and 133 may be a memory such as an HBM. That is, each of the semiconductor chips 131, 132, and 133 may be an expensive chip having several hundreds of thousands or more of inputs/outputs (I/Os), but is not necessarily limited thereto. First and second memories 132 such as an HBM, or the like, may be disposed side-by-side with an ASIC 131 such as a GPU, or the like, at one side of the ASIC 131, and third and fourth memories 133 such as an HBM, or the like, may be disposed side-by-side with an ASIC 131 such as a GPU, or the like, at the other side of the ASIC 131.

The encapsulant 140 may protect the semiconductor chips 131, 132, and 133, and the like. An encapsulation form of the encapsulant 140 is not particularly limited, and may be a form in which the encapsulant 140 surrounds at least portions of the semiconductor chips 131, 132, and 133. A material of the encapsulant 140 is not particularly limited. For example, an insulating material may be used as the material of the encapsulant 140. In this case, a thermosetting resin such as an epoxy resin, a thermoplastic resin such as a polyimide resin, a resin in which the thermosetting resin and the thermoplastic resin are mixed with an inorganic filler, for example, ABF, or the like, may be used as the insulating material. However, the material of the encapsulant 140 is not limited thereto, but may also be prepreg, or the like, including a glass fiber. Alternatively, an epoxy molding compound (EMC), or the like, may also be used as the material of the encapsulant 140. The inactive surfaces of the semiconductor chips 131, 132, and 133 maybe exposed from the encapsulant 140 by a grinding process. In this case, the inactive surfaces of the semiconductor chips 131, 132, and 133 may be disposed on the same level as that of an upper surface of the encapsulant 140. The term "same level" is a concept including cases in which levels are approximately the same as each other, that is, includes an error in a process, as well as cases in which levels are completely the same as each other.

The passivation layer 150 may protect the interposer 110 from external physical or chemical impacts. A material of the passivation layer 150 is not particularly limited. For example, an insulating material may be used as the material of the passivation layer 150. In this case, the insulating material may be the material described as the insulating material of the insulating layer 111 of the interposer 110 described above, for example, the ABF. The passivation layer 150 may have the openings exposing at least portions of the wiring layer 112.

The UBM layer 160 may improve connection reliability of the electrical connection structures 170 to improve board level reliability of the semiconductor package 100A. The UBM layer 160 may include the UBM pads 160P disposed on the passivation layer 150 and the UBM vias 160V formed in the openings of the passivation layer 150 and connecting the UBM pads 160P and the exposed wiring layer 112 to each other. Each of the UBM pads 160P and the UBM vias 160V may include a metal such as copper (Cu), aluminum (Al), silver (Ag), tin (Sn), gold (Au), nickel (Ni), lead (Pd), titanium (Ti), or alloys thereof.

The distance from the center of the UBM pad 160P to the boundary thereof may be irregular. For example, the distance d1 from the center of the UBM pad 160P to the boundary most distant from the center and the distance d2 from the center of the UBM pad 160P to the boundary closest to the center may be different from each other. In more detail, at least one groove portion 160Ph, more preferably, the plurality of groove portions 160Ph may be formed in the outer circumferential surface of the UBM pad 160P. In this case, the distance d1 from the center of the UBM pad 160P to the outer circumferential surface of the region in which the groove portion 160Ph of the UBM pad 160P is not formed may be greater than the distance d2 from the center of the UBM pad 160P to the outer circumferential surface of the region in which the groove portion 160Ph of the UBM pad 160P is formed. The groove portion 160Ph of the UBM pad 160P may be provided so as to accommodate portions of the electrical connection structure 170 which may fill the groove portion 160Ph when the electrical connection structure 170 is provided. As described above, the semiconductor package 100A according to the exemplary embodiment includes the UBM layer 160 having the structure described above, and the reliability of the electrical connection structure 170 may thus be further improved. Particularly, the UBM pad 160P does not have the simple circular shape, but may have, for example, the toothed wheel shape having the protruding portions in the plane to increase the contact area between the UBM pad 160P and the electrical connection structure 170, to have the anchoring effect, and to disperse the shearing stress, resulting in further improvement of the reliability of the electrical connection structure. In the exemplary embodiment, the UBM pad 160P may protrude on the passivation layer 150. Meanwhile, the number, or the like, of groove portions 160Ph of the UBM pad 160P is not particularly limited, and may be more than that illustrated in the drawing or may be less than that illustrated in the drawing. In addition, the groove portion 160Ph may have an angular shape rather than a round shape. That is, a detailed shape of the groove portion 160Ph may be variously modified.

A width of an upper surface of the UBM via 160V in contact with the exposed wiring layer 112 of the interposer 110 may be smaller than that of a lower surface thereof in contact with the UBM pad 160P. Here, the width is decided in relation to a cross-sectional view. In the semiconductor package 100A according to the exemplary embodiment, the interposer 110 is formed by a UBM layer last method, and the UBM via 160V may thus be formed in a trapezoidal shape in which the upper surface thereof has a width smaller than that of the lower surface thereof. In addition, the UBM via 160V may be approximately a filled-via.

The electronic connection structures 170 may physically and/or electrically externally connect the semiconductor package 100A. For example, the semiconductor package 100A may be mounted on a BGA substrate, or the like, through the electrical connection structures 170. Each of the electrical connection structures 170 may be formed of a conductive material, for example, a solder including tin (Sn)-aluminum (Al)-copper (Cu) alloys, or the like. However, this is only an example, and a material of each of the electrical connection structures 170 is not limited thereto. Each of the electrical connection structures 170 may be a land, a ball, a pin, or the like. The electrical connection structures 170 may be formed as a multilayer or single layer structure. When the electrical connection structures 170 are formed as a multilayer structure, the electrical connection structures 170 may include a copper (Cu) pillar and a solder. When the electrical connection structures 170 are formed as a single layer structure, the electrical connection structures 170 may include a tin-silver solder or copper (Cu). However, this is only an example, and the electrical connection structures 170 are not limited thereto.

The number, an interval, a disposition form, and the like, of electrical connection structures 170 are not particularly limited, and may be sufficiently modified depending on design particulars by those skilled in the art. For example, the electrical connection structures 170 may be provided in an amount of several thousands to several hundreds of thousands according to the numbers of connection pads 131P, 132P, and 133P, or may be provided in an amount of several thousands to several hundreds of thousands or more or several thousands to several hundreds of thousands or less.

Figure 9:
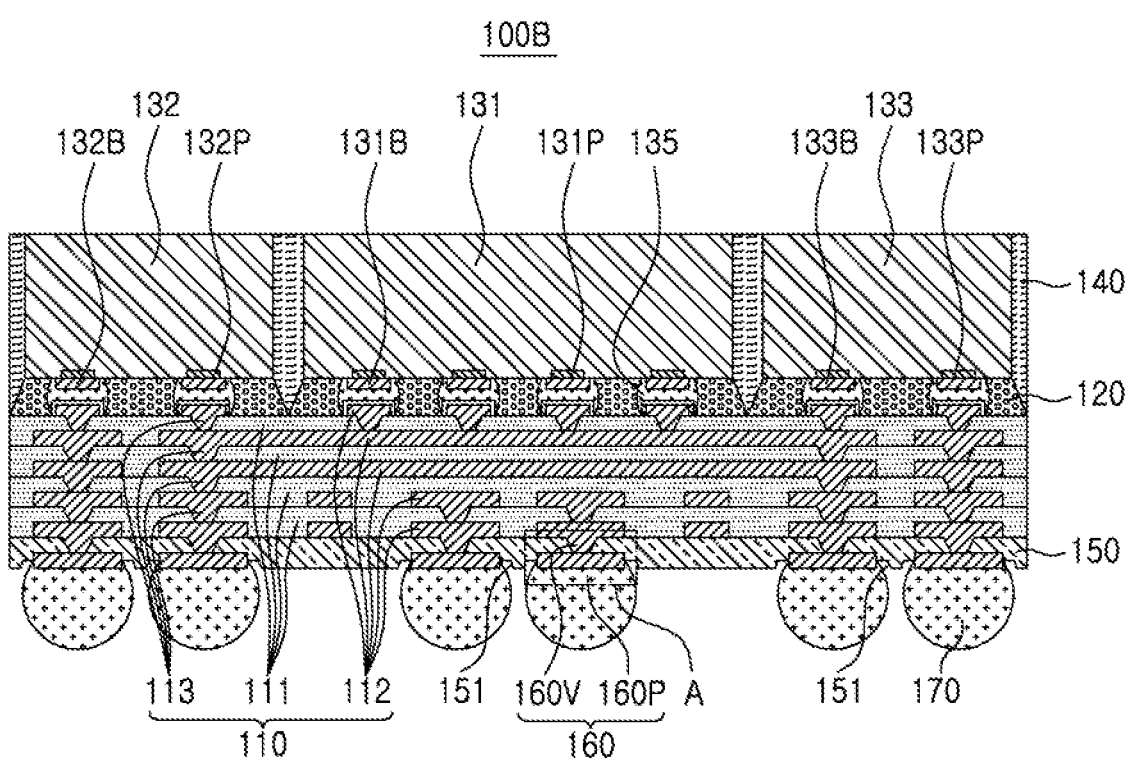
FIG. 9 is a schematic cross-sectional view illustrating another example of a semiconductor package.

FIG. 9 is a schematic cross-sectional view illustrating another example of a semiconductor package.

Referring to FIG. 9, in a semiconductor package 100B according to another exemplary embodiment, a passivation layer 150 may further have indentations or openings 151 formed in a lower surface thereof and exposing surfaces of UBM pads 160P and at least portions of side surfaces of the UBM pads 160P. The openings 151 are formed in addition to openings in which UBM vias 160V are formed, and at least portions of the side surfaces of the UBM pads 160P may be exposed through the openings 151, such that connection reliability between the UBM pads 160P and electrical connection structures 170 may be improved. That is, at least portions of the UBM pads 160P may be embedded in the passivation layer 150. A lower surface of the passivation layer 150 may be disposed on a level that is substantially the same as that of a lower surface of the UBM pad 160P. The reason is that the UBM pads 160P are formed to be exposed to the surface of the passivation layer 150 and are then subjected to a grinding process, or the like. The openings 151 are then formed in the passivation layer 150 so as to expose at least portions of the side surfaces of the UBM pads 160P. The term "same level" means that surfaces are coplanar with each other, and a slight flexion, or the like, depending on processes is ignored.

The UBM layer 160 may include the UBM pads 160P embedded in the passivation layer 150 so that portions of the side surfaces thereof are exposed and the UBM vias 160V penetrating through at least portions of the passivation layer 150 and electrically connecting an exposed wiring layer 112 of an interposer 110 and the UBM pads 160P to each other. The UBM pads 160P may have protruding portions protruding in the openings 151 of the passivation layer 150. Side surfaces of the protruding portions may be spaced apart from sidewalls of the openings 151. The electrical connection structures 170 may cover the exposed surfaces and side surfaces of the UBM pads 160P. In another exemplary embodiment, the UBM pad 160P of the UBM layer 160 may have a non-circular shape, for example, a toothed wheel shape in a plane, as described above. That is, a description of region A overlaps that described above.

A width of an upper surface of the UBM via 160V in contact with the exposed wiring layer 112 of the interposer 110 may be greater than that of a lower surface thereof in contact with the UBM pad 160P. Here, the width is decided in relation to a cross-sectional view, such as the cross-sectional view shown in FIG. 9. Ina case in which the UBM layer described above in relation to FIG. 6 is used, the width of the upper surface of the UBM via is generally smaller than that of the lower surface thereof. On the other hand, in the semiconductor package 100B according to another exemplary embodiment, a UBM layer first method is used, and the UBM via 160V may thus be formed in a reverse trapezoidal shape in which the width of the upper surface thereof is greater than that of the lower surface thereof. In addition, the UBM via 160V may be approximately a filled-via. A description of other configurations overlaps that described above, and is thus omitted.

As set forth above, according to the exemplary embodiments in the present disclosure, a semiconductor package in which high reliability of electrical connection structures may be secured may be provided.

While exemplary embodiments have been shown and described above, it will be apparent to those skilled in the art that modifications and variations could be made without departing from the scope of the present invention as defined by the appended claims.

What is claimed is:

1. A semiconductor package comprising:
an organic interposer including insulating layers and wiring layers disposed on the insulating layers;

a semiconductor chip disposed on one surface of the organic interposer and having an active surface having connection pads disposed thereon and an inactive surface opposing the active surface;

an encapsulant disposed on the organic interposer and encapsulating at least portions of the semiconductor chip;

a passivation layer disposed on another surface of the organic interposer opposing the one surface of the organic interposer on which the semiconductor chip is disposed and having openings extending to at least portions of the wiring layer; and an underbump metallurgy (UBM) layer including UBM pads disposed on the passivation layer and UBM vias disposed in the openings and connecting the UBM pads and the wiring layer to each other, wherein at least one groove portion is disposed in an outer circumferential surface of the UBM pad.

2. The semiconductor package of claim 1, wherein a distance from a center of the UBM pad to an outer circumferential surface of a region in which the groove portion of the UBM pad is not disposed is greater than a distance from the center of the UBM pad to an outer circumferential surface of a region in which the groove portion of the UBM pad is disposed.

3. The semiconductor package of claim 2, further comprising electrical connection structures disposed on the passivation layer and connected to the UBM pads,
wherein the groove portion is filled with the electrical connection structure.

4. The semiconductor package of claim 1, wherein at least portions of the UBM pad protrude below a lower surface of the passivation layer.

5. The semiconductor package of claim 4, wherein a width of an upper surface of the UBM via in contact with the wiring layer is smaller than a width of a lower surface of the UBM via in contact with the UBM pad.

6. The semiconductor package of claim 1, wherein at least portions of the UBM pad are embedded in the passivation layer.

7. The semiconductor package of claim 6, wherein a width of an upper surface of the UBM via in contact with the wiring layer is greater than a width of a lower surface of the UBM via in contact with the UBM pad.

8. The semiconductor package of claim 1, wherein a conductive bump is further disposed on the connection pad of the semiconductor chip.

9. The semiconductor package of claim 8, wherein the conductive bump includes a low melting point metal.

10. The semiconductor package of claim 1, wherein the semiconductor chip includes a graphics processing unit (GPU) and a plurality of high bandwidth memories (HBMs) disposed in the vicinity of the GPU, and
the GPU and the HBMs are electrically connected to each other through the wiring layer.

11. The semiconductor package of claim 1, wherein the inactive surface of the semiconductor chip is exposed from the encapsulant.

12. A semiconductor package comprising:
a semiconductor chip having an active surface having connection pads disposed thereon and an inactive surface opposing the active surface;

an encapsulant encapsulating at least portions of the semiconductor chip;

a connection member disposed on the active surface of the semiconductor chip and including a wiring layer electrically connected to the connection pads;

a passivation layer disposed on the connection member and having openings extending to at least portions of the wiring layer; and a UBM layer including UBM pads disposed on the passivation layer and UBM vias disposed in the openings and connecting the UBM pads and the exposed wiring layer to each other, wherein a boundary of each UBM pad, on the passivation layer, includes at least one concave portion.

13. The semiconductor package of claim 12, wherein the UBM pad has a shape that includes a plurality of protrusions spaced apart from each other and extending from central portion of the UBM pad.

14. The semiconductor package of claim 12, wherein a surface of the passivation layer is exposed in the at least one concave portion of the boundary of the UBM pad.

15. The semiconductor package of claim 14, further comprising a conductive bump disposed on the UBM pad of the semiconductor chip, and extending in the at least one concave portion of the boundary of the UBM pad.

16. An interposer configured to have a semiconductor chip mounted on an upper surface thereof, comprising:
an insulating material forming a body of the interposer;

a plurality of wiring layers disposed in an insulating material of the body, and disposed on the upper surface of the interposer to be connected to connections pads of the semiconductor chip;

a plurality of vias penetrating through the insulating material of the body to interconnect adjacent wiring layers of the plurality of wiring layers;

a passivation layer disposed on a lower surface of the interposer opposite to the upper surface and having a plurality of openings each extending to a wiring layer; and at least one UBM pad disposed on a lower surface of the passivation layer, and connected to the wiring layer through a connection via extending through an opening of the plurality of openings, wherein an outline of an area occupied by the at least one UBM pad on the lower surface of the passivation layer includes at least one concave portion.

17. The interposer of claim 16, wherein the an area occupied by the at least one UBM pad has a shape that includes a plurality of protrusions spaced apart from each other by the at least one concave portion.

18. The interposer of claim 16, wherein the lower surface of the passivation layer is exposed in the at least one concave portion of the boundary of the UBM pad.

19. The interposer of claim 16, wherein the area occupied by the at least one UBM pad on the lower surface of the passivation layer includes a plurality of evenly-spaced concave portions disposed along an outer periphery of the area.

20. The interposer of claim 16, wherein at least portions of side surfaces of the at least one UBM pad are spaced apart from the passivation layer.

* * * * *